(12) United States Patent
Teraoka et al.

(10) Patent No.: US 10,618,127 B2
(45) Date of Patent: Apr. 14, 2020

(54) VACUUM PICK-UP CONFIRMATION SYSTEM

(71) Applicant: Hakko Corporation, Osaka (JP)

(72) Inventors: Yoshitomo Teraoka, Osaka (JP); Hisao Nemoto, Osaka (JP)

(73) Assignee: Hakko Corp. (JP)

( * ) Notice: Subject to any disclaimer, the term of this patent is extended or adjusted under 35 U.S.C. 154(b) by 0 days.

(21) Appl. No.: 15/377,836

(22) Filed: Dec. 13, 2016

(65) Prior Publication Data
US 2018/0161903 A1  Jun. 14, 2018

(51) Int. Cl.
*B23K 1/018* (2006.01)
*H05K 13/04* (2006.01)
*B23K 1/00* (2006.01)

(52) U.S. Cl.
CPC ............ *B23K 1/018* (2013.01); *B23K 1/0016* (2013.01); *H05K 13/0486* (2013.01)

(58) Field of Classification Search
None
See application file for complete search history.

(56) References Cited

U.S. PATENT DOCUMENTS

| | | | | |
|---|---|---|---|---|
| 4,206,864 A | * | 6/1980 | Rauchwerger | B23K 1/018 15/341 |
| 4,919,322 A | * | 4/1990 | Fortune | A61B 17/50 222/570 |
| 5,280,668 A | * | 1/1994 | Fortune | A47L 5/24 15/341 |
| 5,598,965 A | * | 2/1997 | Scheu | B23K 1/018 228/49.5 |
| 6,131,791 A | * | 10/2000 | Masaki | B23K 1/018 228/119 |
| 6,761,304 B2 | * | 7/2004 | Ruszowski | B23K 1/018 219/227 |
| 2006/0225270 A1 | * | 10/2006 | Wong | B23K 3/087 29/739 |
| 2016/0175959 A1 | * | 6/2016 | Mochizuki | B23K 1/0016 228/20.5 |
| 2017/0148762 A1 | * | 5/2017 | Ayotte | H01L 24/98 |

FOREIGN PATENT DOCUMENTS

| | | |
|---|---|---|
| JP | A 1993-335449 | 12/1993 |
| JP | A 1997-036536 | 2/1997 |
| JP | A 1997-036538 | 2/1997 |
| JP | A 1997-326553 | 12/1997 |
| JP | A 2010-158687 | 7/2010 |

* cited by examiner

*Primary Examiner* — Devang R Patel
(74) *Attorney, Agent, or Firm* — David B. Abel

(57) ABSTRACT

The present invention defines a tool including a heating device including a method and apparatus to allow the user to check whether, or be notified when, the soldered electronic component is completely removed from a substrate after the solder is sufficiently melted.

14 Claims, 18 Drawing Sheets

VACUUM PICK-UP CONFIRMATION SYSTEM

FIELD OF THE INVENTION

The present invention relates to soldering and desoldering devices, and more particularly, to a device that uses an improved pickup confirmation device for soldering or desoldering an item such as an electrical component.

The invention uses a technique to remove electrical components from the printed circuit board by melting the solder with hot air while picking or removing the electronic component from a substrate, such as for example a printed circuit board, by the application of a vacuum or negative pressure provided by a vacuum source.

BACKGROUND OF THE INVENTION AND RELATED ART

Conventional devices for dismounting an electrical component, such as a ball grid array ("BGA"), chip scale package ("CSP") or a plastic leaded chip carrier ("PLCC"), by melting the solder of a soldered connection with hot air and then removing the component from a printed wiring or circuit board are known.

During the desoldering process, the related art discloses that a spring assists in the removal of a component once a suction cup is attached. The user can turn the adjustment knob to apply a spring loading by compressing the spring. The vacuum pickup tube and the suction cup will exert sufficient suction to remain affixed to the component. When the solder melts the spring will automatically lift the component free of the substrate.

However, in the prior art designs, the structure does not allow the user to confirm when the solder is sufficiently melted so that the component can be safely detached. In many cases, a large number of electronic components are densely placed on the printed wiring or circuit board substrate. Therefore, surrounding electronic components located next to and around the electronic component to be lifted by the heating device often block the line of sight of the operator who is trying to remove a component. In some cases, the operator may not notice the displacement or lifting of the component after the solder has been melted allowing the electronic component to be separated from the substrate. If the operator does not notice the upward displacement of the electronic component, the operator may continue to apply heat to the substrate and the surrounding electronic components, and the substrate and surrounding electronic components may be thermally damaged. Alternatively, the operator may at times attempt to lift the heating device upward to confirm whether the solder has been sufficiently melted, before the component can be safely removed. If the melting of the solder is insufficient, the lands of the circuit board may be damaged. For this reason, a failure such as overheating of the component due to a long period of application of hot air, or peeling off the land of the substrate when the user lifts the handle before the solder is completely melted may occur.

BRIEF DESCRIPTION OF THE INVENTION

A purpose of the present invention is to provide a heating device including a method and apparatus to allow the user to check whether, or be notified when, the soldered electronic component is completely removed from a substrate after the solder is sufficiently melted. The concepts of the present invention can be included in, for example, a surface mounted device ("SMD") rework procedure having a thermal profile for the proper removal of the SMD, to check that the component is properly removed in the final removal stage of the thermal profile. The concept of the present invention also helps to improve manual operation when the handle is held by the hand of a user or operator.

A heating device according to one aspect of the present invention is used for melting a bonding material used for fixing an electronic component and detaching the electronic component. The heating device includes a holding member having a holding part for holding the electronic component, and an enclosure partly surrounding the holding mechanism. The holding mechanism includes an urging portion such as a bias spring for urging the holding part upward and an indicator displaced in conjunction with restoration of the urging portion upon the melting of the bonding material and lifting of the electronic component. The enclosure partly surrounding the holding mechanism includes a transparent region that allows the operator to visually recognize the displacement of the indicator linked with the restoration of the bias member upon the complete melting of the bonding material. Restoration of the bias member means that the bonding material is sufficiently melted and the electronic component has been safely released. The holding mechanism may include a suction pipe that transmits a suction force for sucking the electronic component. The holding part may be the tip of the suction pipe. The bias member may be a coil spring wound around or positioned around the suction pipe.

DETAILED DESCRIPTION OF THE INVENTION

Figure 1:
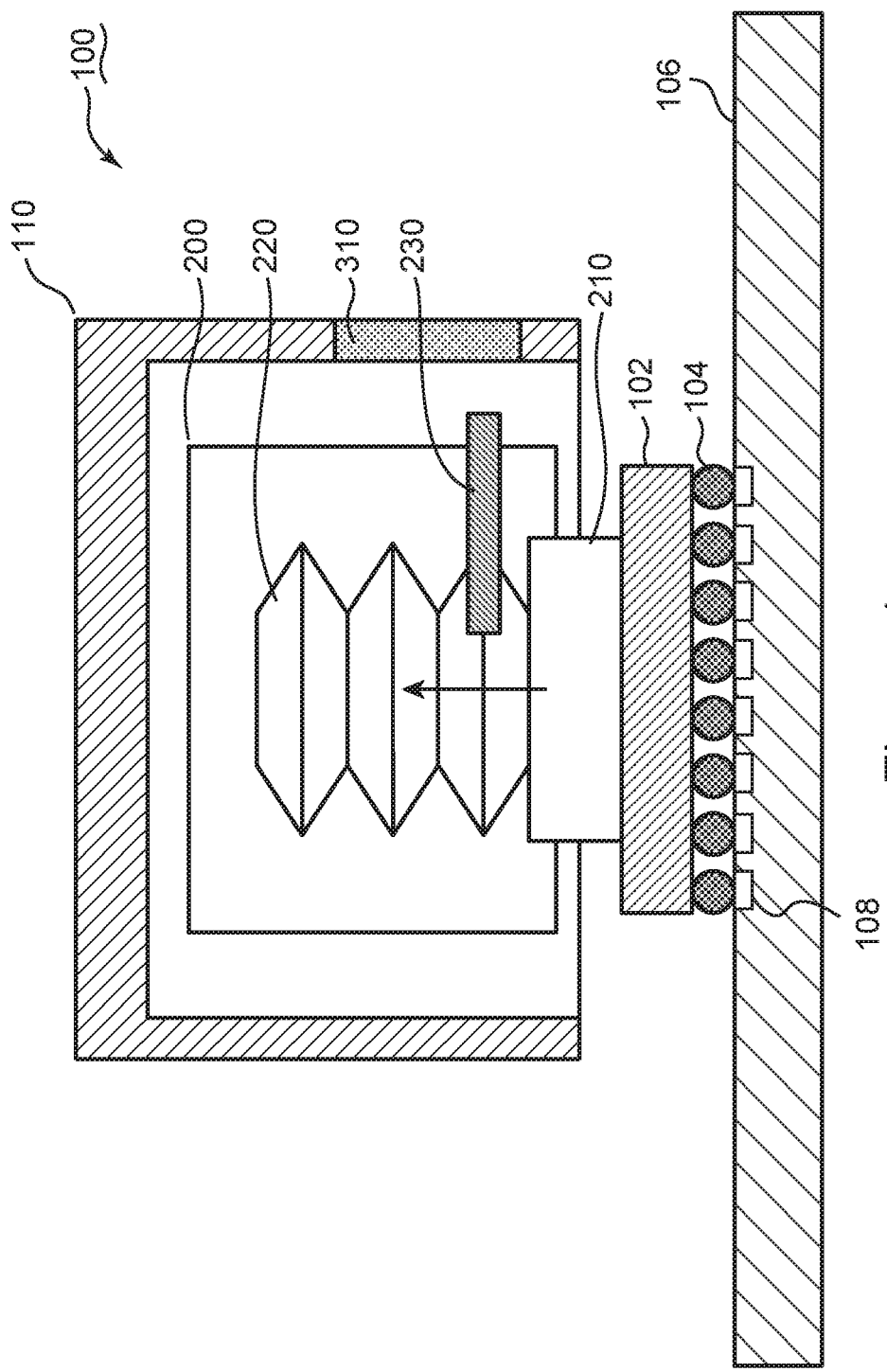
FIG. 1 is an illustrative cross section of the heating device of a re-work tool according to a first embodiment of the present invention, and an electrical component attached to a circuit board.

FIG. 1 is an illustrative cross section of the distal end heating device 100 of a re-work tool according to a first embodiment of the present invention, and an electrical component 102, having a plurality of contacts 104, allowing for the attachment of the electrical component 102 to a printed circuit board 106 having a plurality of electrical contact pads 108 to match with and bond to the contacts 104.

The heating device 100 includes a holding member 200 and an enclosure 110. The holding member 200 is configured to hold an electrical component as it is being removed from the printed circuit board 106. The enclosure 110 partially surrounds the holding member 200. The enclosure 110 may include a handle to allow it to be gripped by an operator. Alternatively, the enclosure 110 may be a distal end portion of a cylindrical member that contains the holding member 200, and which may be connected to a positioning device (not shown) designed to adjust the position of the heating device 100 over a specific component of a printed circuit board for repetitive operations.

The holding member 200 includes a holding part 210, a bias member 220, and an indicator 230. The holding part 210 is configured to be attached to and hold the electronic component 102. The holding part 210 may affix to the electronic component 102 by using a suction force generated by a vacuum supplied by a controller for the rework tool (not shown). Alternatively, the holding part 210 may include a distal surface coated with an adhesive. In this case, the holding part 210 can hold the electronic component by the adhesive force of the adhesive. As another alternative, the holding portion 210 may be a resilient suction cup. As another alternative, the holding part 210 may be designed to mechanically engage the electronic component. If destruction of the electronic component is permitted, the holding part 210 may be a screw member screwed into the electronic component 102. The principle of the present embodiment may be applied to any of the embodiments of the holding part 210.

The bias member 220 urges the holding part 210 upward as depicted in FIG. 1, and away from the substrate. The bias member 220 may be directly connected to the holding part 210. Alternatively, the bias member 220 may be indirectly connected to the holding part 210 via other components. The principle of the present embodiment is applicable for various structures for transmitting the urging force of the bias member 220 to the holding part 210. The bias member 220 may be a coil spring. Alternatively, the bias member 220 may be a leaf spring. Still alternatively, the bias member 220 may be a bellows tube designed to resiliently deform. Thus the present invention is not limited to a specific elastic or resilient element forming the bias member 220.

As noted above, the holding member 200 includes an indicator 230. The indicator 230 is preferably attached to a distal portion of the bias member 220 as shown in FIG. 1, but it may alternatively be attached to the holding part 210. In either configuration, the indicator is arranged to move upward, or away from the printed circuit board, when the desoldering operation is completed and the bias member 220 picks or lifts the electrical component 102 off of the printed circuit board 106.

As depicted in FIG. 1, the enclosure 110 includes a transparent area 310. The transparent area 310 is positioned to allow a user or operator to see the indicator 230. Therefore, the user or operator can visually check the displacement of the indicator 230 by looking through the transparent area 310. Since the transparent area 310 is preferably formed at a position sufficiently displace from the distal end of the heating device 100, and thus sufficiently above the surface of the printed circuit board such that surrounding components do not obstruct the view of the indicator 230, the operator can confirm separation of the electronic component 102 from the substrate of the printed circuit board 106 based upon the movement and position of the indicator 230.

The term "transparent" means that the operator can visually recognize the indicator 230 disposed in the enclosure 110 through the transparent area 310 of the enclosure 110. Accordingly, the transparent area 310 may be formed from a transparent material, such as glass or a clear plastic. If the material of the transparent area 310 is not clear, it should at least be only lightly colored glass or plastic. Alternatively, the transparent area 310 may be simply an opening formed in the enclosure 110, or the indicator may extend though a slot shaped opening in the enclosure 110. In any case, the size of the transparent area 310 should be sufficient to cover the maximum displacement range of the indicator 230. As another alternative, the entire enclosure 110 may be formed of a totally transparent material and the transparent area 310 would be the area disposed outwardly from the indicator 230.

Figure 2:
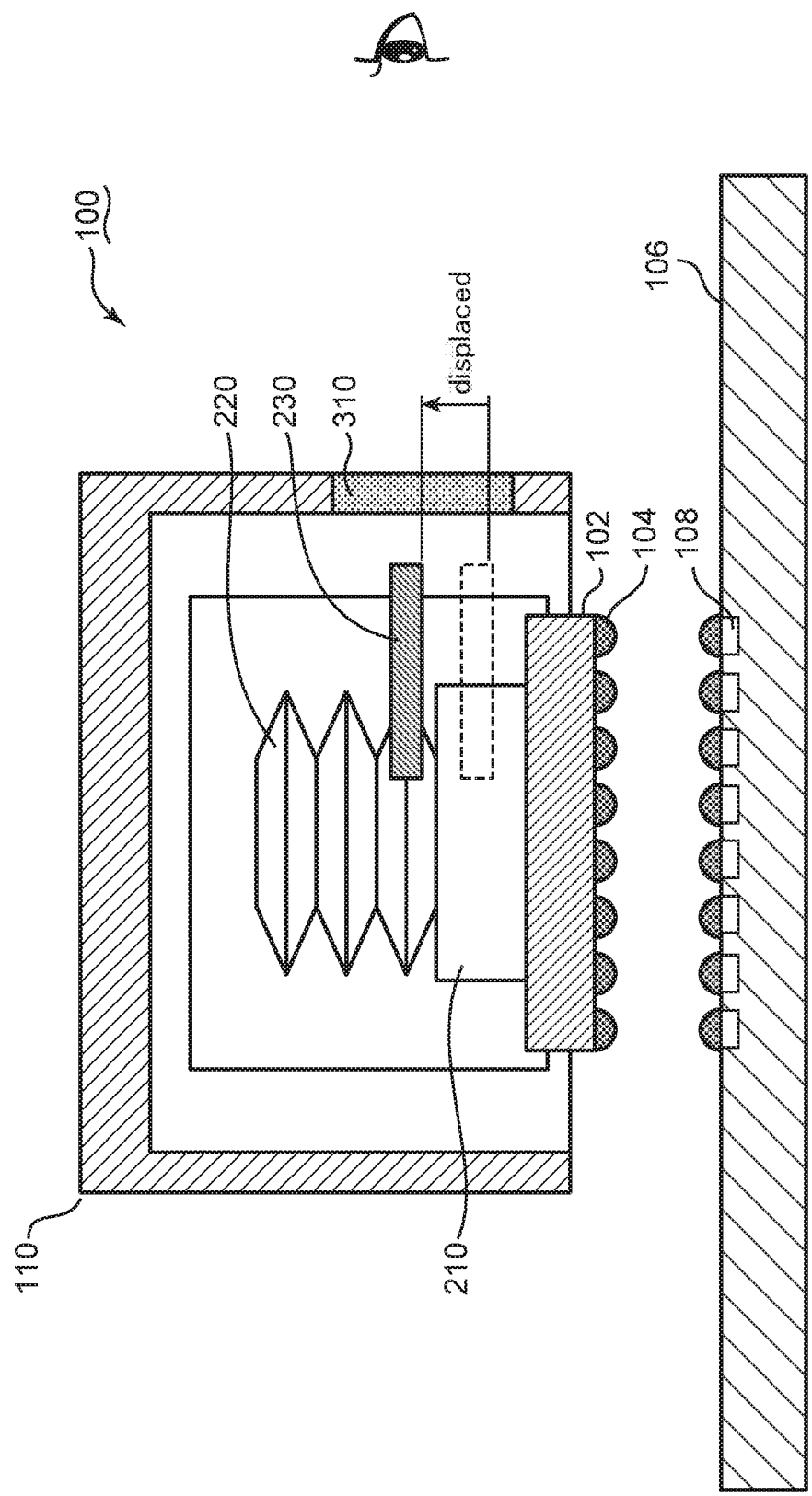
FIG. 2 is an illustrative cross section of the heating device of a re-work tool shown in FIG. 1, wherein the electrical component has been removed by the heating device.

FIG. 2 is an illustrative cross section of the heating device of a re-work tool shown in FIG. 1, wherein the electrical component 102 is shown as having been removed by the heating device 100. When the bonding material is melted, the bonding force between the electronic component and the substrate becomes very weak. On the other hand, the coupling force between the holding part 210 and the electronic component 102 is maintained. Therefore, due to the restoring force of the bias member 220 returning to its natural length, the electronic component 102 is separated from the substrate of the printed circuit board 106 and pulled upward together with the holding part 210. As shown in FIG. 2, the indicator 230 has displaced upward with the restoration of the bias member 220, and the location of the indicator 230 may be observed to have changed by the operator or user.

Figure 3:
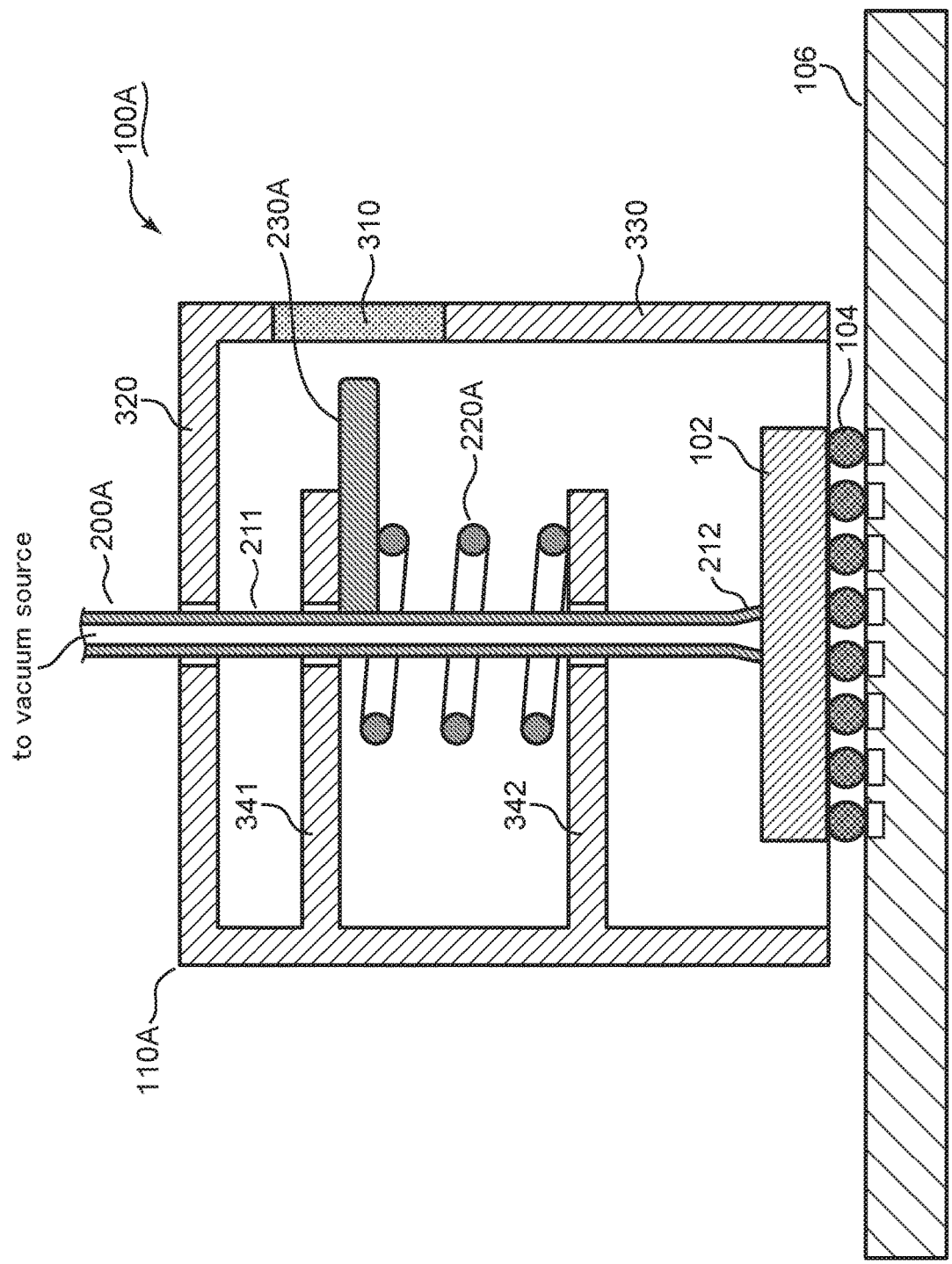
FIG. 3 is an illustrative cross section of the heating device of a re-work tool of a second embodiment of the present invention, and an electrical component attached to a circuit board.

FIG. 3 is an illustrative cross section of the heating device 100A of a re-work tool of a second embodiment of the present invention, covering an electrical component 102 attached to a circuit board 106. The heating device 100A includes a holding mechanism 200A and an enclosure 110A. The holding member 200A holds the electronic component. The enclosure 110A partially surrounds the holding member 200A. The enclosure 110A includes an upper wall 320, a surrounding wall 330, an upper protrusion 341, and a lower protrusion 342. The upper wall 320 is substantially parallel to the substrate. The surrounding wall 330 extends from the upper wall 320 toward the substrate and partially surrounds the holding member 200A. Therefore, the enclosure 110A is generally cylindrical in shape, although it may be square or rectangular in shape to accommodate the shape of the electrical component 102. The enclosure 110A includes a transparent area 310 similar to the transparent area 310 described in connection with the first embodiment formed in the surrounding wall 330.

The upper protrusion 341 protrudes inwardly from the surrounding wall 330 substantially in parallel with the substrate within the enclosure body 300A. Similarly to the upper protrusion 341, the lower protrusion 342 protrudes inwardly from the surrounding wall 330 substantially in parallel to the substrate within the enclosure body 300A. The lower protrusion 342 is located between the upper protrusion 341 and the substrate.

The holding member 200A comprises a suction pipe 211, a coil spring 220A, and an indicator 230A. The suction pipe 211 includes a distal or lower end 212 that is brought into contact with the upper surface of the electronic component 102 fixed to the substrate 106 by the bonding material. The suction pipe 211 extends upward from the lower end 212 and passes through holes formed in the lower protrusion 342, the upper protrusion 341, and the upper wall 320, respectively, whereby the suction pipe 211 is vertically moveable within the heating device 100A. The suction pipe 211 is connected to a vacuum device disposed outside of the enclosure 110A and outside of the heating device 100A. The suction force or vacuum force generated by the vacuum device is applied to the upper surface of the electronic component 102 through the suction pipe 211. As a result, the upper surface of the electronic component may be attached to the lower end 212 of the suction pipe 211. The distal or lower end 212 of the suction pipe 211 is preferably flared to form an enlarged opening having an area greater than the cross sectional area of the portion of the suction pipe 211 extending through the structures of the enclosure 110A. As a result, the suction force as between the electronic component and the lower end 212 of the suction pipe 211 is increased. The lower end 212 of the suction pipe 211 corresponds to the holding part 210 described above with reference to FIG. 1.

The coil spring 220A as depicted in FIG. 3 is positioned around the suction pipe 211 and located between the upper protrusion 341 and the lower protrusion 342. The diameter of the coil spring 220A is larger than the diameter of the through hole of the lower protrusion 342, and the coil spring 220A is supported by the lower protrusion 342. The coil spring 220A corresponds to the bias member 220 described above with reference to FIG. 1.

The indicator 230A is fixed to the suction pipe 211 between the upper protrusion 341 and the lower protrusion 342. The indicator 230A may be attached so as to protrude from the suction pipe 211 toward the transparent area 310. Therefore, the operator can visually identify the position of the indicator 230A looking through the transparent area 310. If necessary, a fluorescent paint may be applied to the end of the indicator 230A. Alternatively, the fluorescent paint may be applied to entirely cover the indicator 230A. The indicator 230A corresponds to the indicator 230 described above with reference to FIG. 1.

Figure 4A:
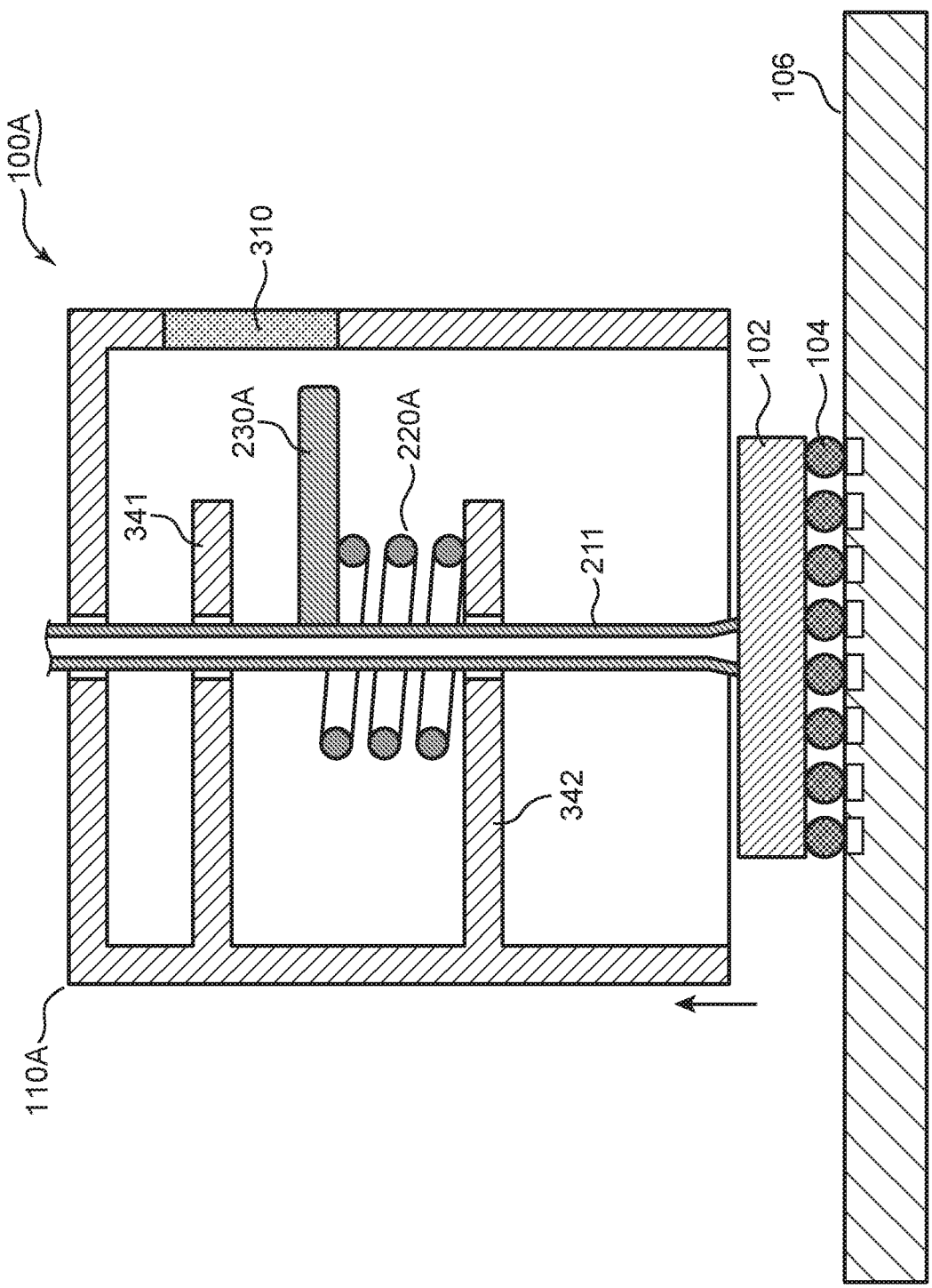
FIG. 4A is an illustrative cross section of the heating device of a re-work tool shown in FIG. 3, where the electrical component is being biased by the heating device.

FIG. 4A is an illustrative cross section of the heating device 100A of the re-work tool shown in FIG. 3, wherein the electrical component 102 is being biased in that it is being subjected to the restorative spring force while the suction pipe 211 in contact with an upper surface of the electrical component 102 applies a suction force. The lower end of the coil spring 220A is in contact with the lower protrusion 342, while the upper end of the coil spring 220A is in contact with the indicator 230A fixed to the suction pipe 211. When the operator moves the enclosure 110A upward as represented by the arrow in FIG. 4A, the lower protrusion 342 is displaced upward. However, when the bonding material securing the electrical component 102 to the printed circuit board 106 has not melted, the electrical component 102, the suction pipe 211 and the indicator 230A are not displaced. Therefore, the distance between the lower protrusion 342 and the indicator 230A is shortened. As a result, the coil spring 220A is elastically compressed by the lower protrusion 342 and the indicator 230A. At this time, the operator can notice the relative position of the indicator 230A in the viewing range of the transparent area 310. As a result of the compression of the coil spring 220A, an upward force is transmitted through the indicator 230A and the suction pipe 211 to the electrical component 102.

Figure 4B:
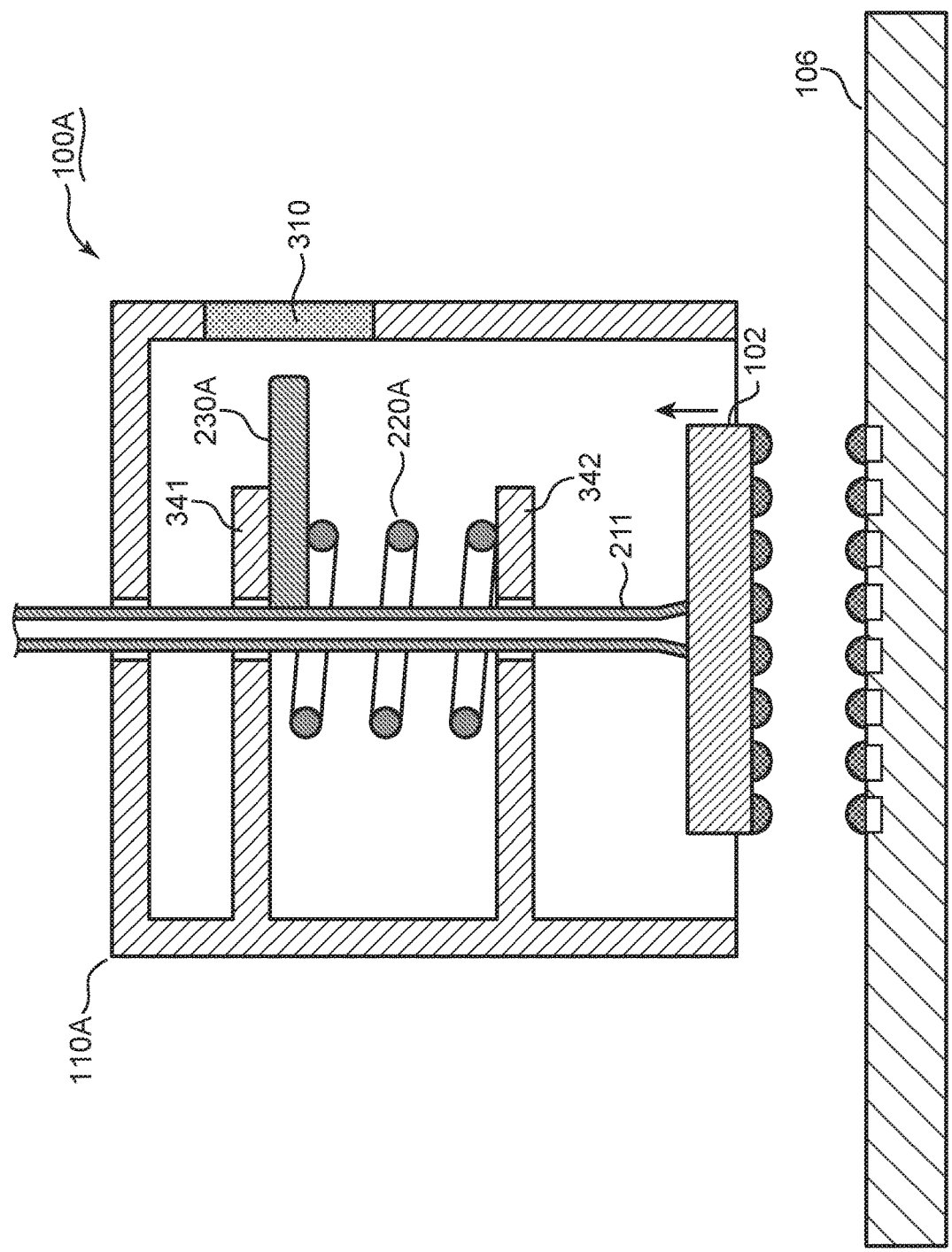
FIG. 4B is an illustrative cross section of the heating device of a re-work tool shown in FIG. 3, where the electrical component is removed by the heating device.

FIG. 4B is an illustrative cross section of the heating device 100A of the re-work tool shown in FIG. 3 and FIG. 4A, as it appears after the solder bonding material has melted. When the bonding material has melted, the bonding force between the electrical component 102 and the printed circuit board 106 is weakened. As a result, the electrical component 102 and the indicator 230A are displaced upward by the upward force acting on the indicator 230A and the suction pipe 211 due to the restoring force of the coil spring 220A. The indicator 230A becomes sandwiched between the upper end of the restored coil spring 220A and the lower side of the upper protrusion 341. Since the indicator 230A is displaced relative to the enclosure body 300A upon the restoration of the coil spring 220A, the relative position of the indicator 230A as viewed through the transparent area 310 is different before and after the melting of the bonding material. Therefore, the operator can know that upon the displacement of the indicator 230A as viewed through the transparent area 310, the electrical component 102 has been safely removed from the printed circuit board 106.

Figure 5:
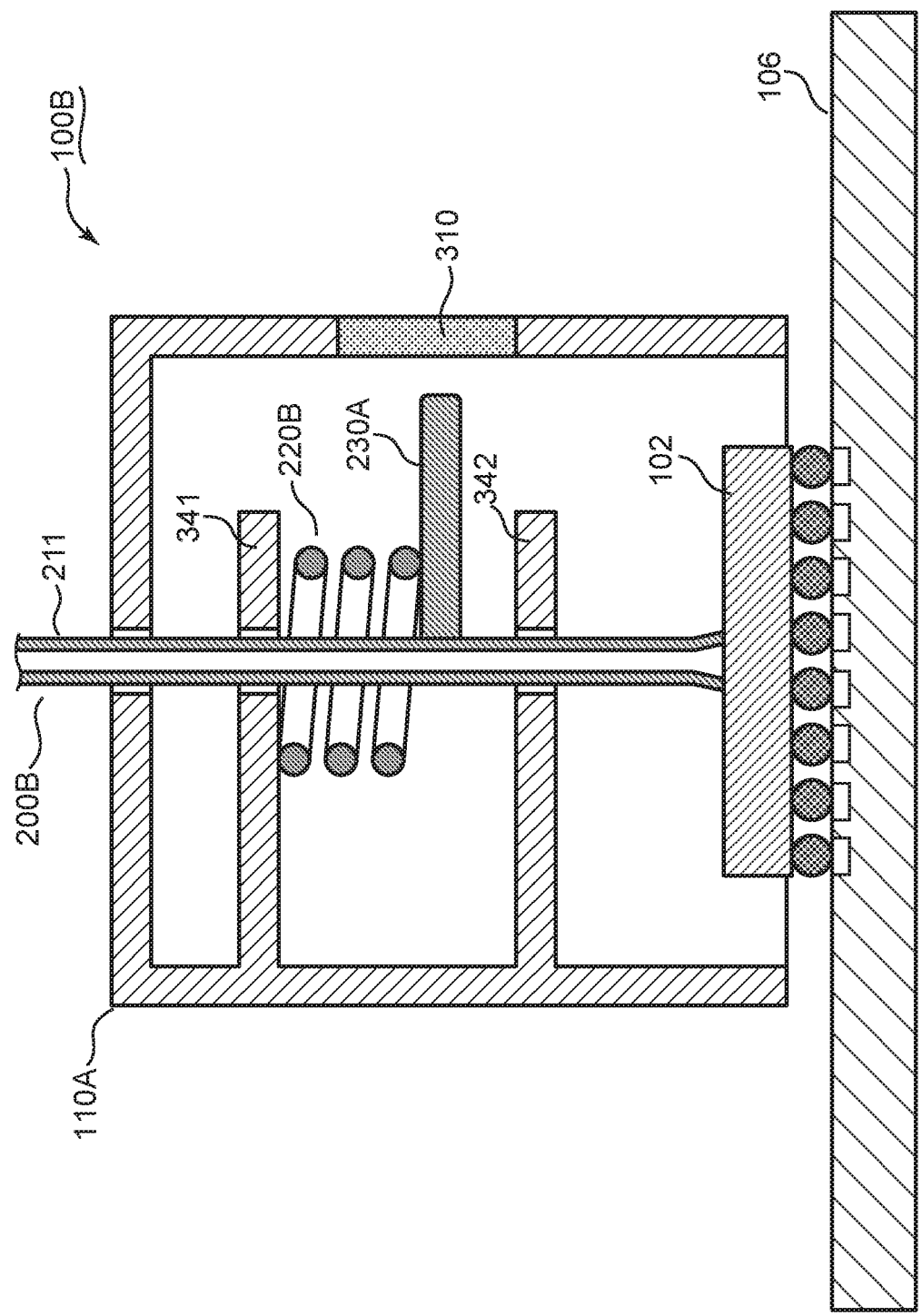
FIG. 5 is an illustrative cross section of the heating device of a re-work tool of a third embodiment of the present invention, and an electrical component attached to a circuit board.

FIG. 5 is an illustrative cross section of an alternative heating device 100B of a re-work tool of a third embodiment of the present invention, and an electrical component 102 attached to a circuit board 106. FIG. 5 depicts a heating device 100B that is structurally similar to the heating device of FIGS. 3, 4A and 4B, with the primary difference being that the indicator 230A is attached to the suction pipe 211 below the bottom of the coil spring 220B, so that the spring is bounded by and connected to the bottom of the upper protrusion 341 and the top of the indicator 230A. The similar components of the heating device of FIG. 5 and FIG. 3 are similarly numbered. The configuration of the alternative design of FIG. 5 (and FIGS. 6A and 6B) uses the elastic extension of the coil spring 220B to provide an upward force on the suction pipe and the electronic component. As depicted in FIG. 5, the heating device 100B is placed over the electrical component 102 so that the end of the suction pipe 211 contacts the top of the electrical component 102.

Figure 6A:
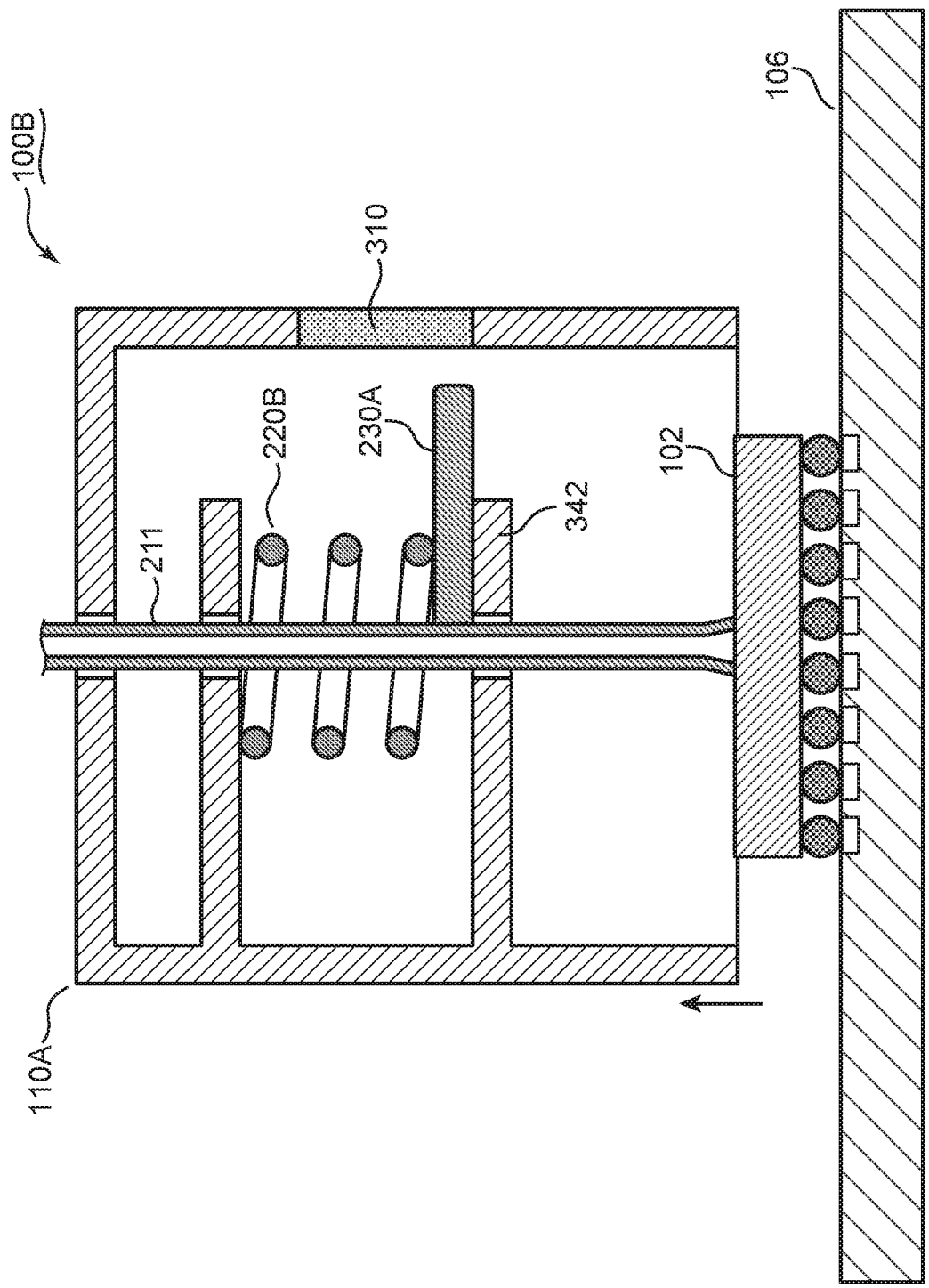
FIG. 6A is an illustrative cross section of the heating device of a re-work tool shown in FIG. 5, where the electrical component is being biased by the heating device.

FIG. 6A is an illustrative cross section of the heating device 100B of FIG. 5, where the operator has lifted the heating device 100B, as shown by the arrow, and the electrical component 102 is being biased by the elastic extension of the coil spring 220B. As depicted in FIG. 6A, the coil spring 220B is elongated and the indicator 230A in contact with the upper surface of the lower protrusion 342, providing the operator with a tactile feedback. The indicator appears at the bottom of the transparent area 310, so that the operator can see that the electrical component 102 remains attached to the printed circuit board 106.

Figure 6B:
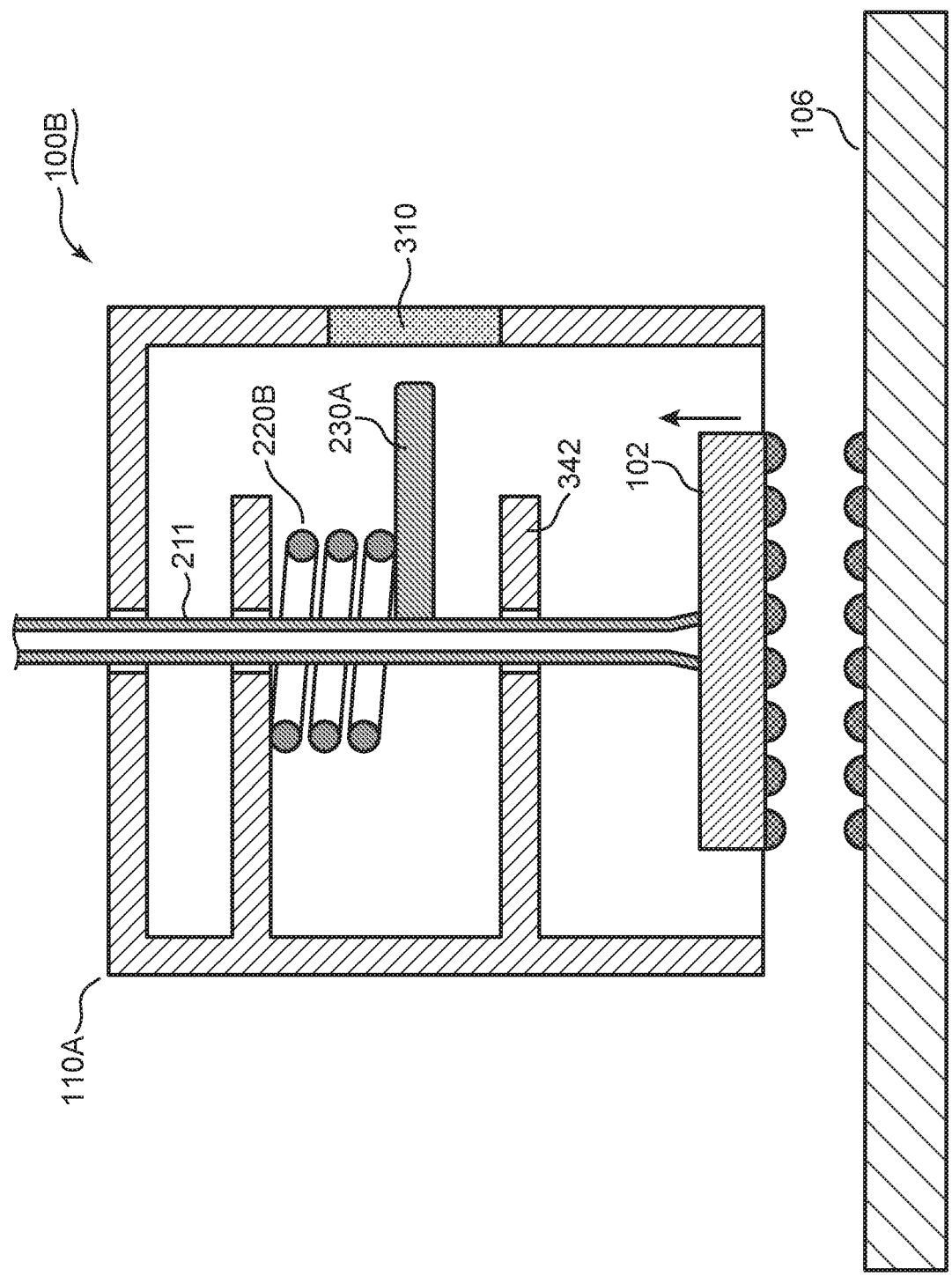
FIG. 6B is an illustrative cross section of the heating device of a re-work tool shown in FIG. 5, where the electrical component is removed by the heating device

FIG. 6B is an illustrative cross section of the heating device 100B of FIGS. 5 and 6A, wherein the electrical component 102 has lifted off of the printed circuit board 106 by the force of the coil spring 220B returning to its relaxed state as soon as the bonding material has melted. Upon the lifting of the electrical component 102, the operator can see through the transparent area 310 that the indicator 230A has moved upward, and thus the operator will know that the electrical component 102 has been safely removed by the heating device 100B.

Figure 7:
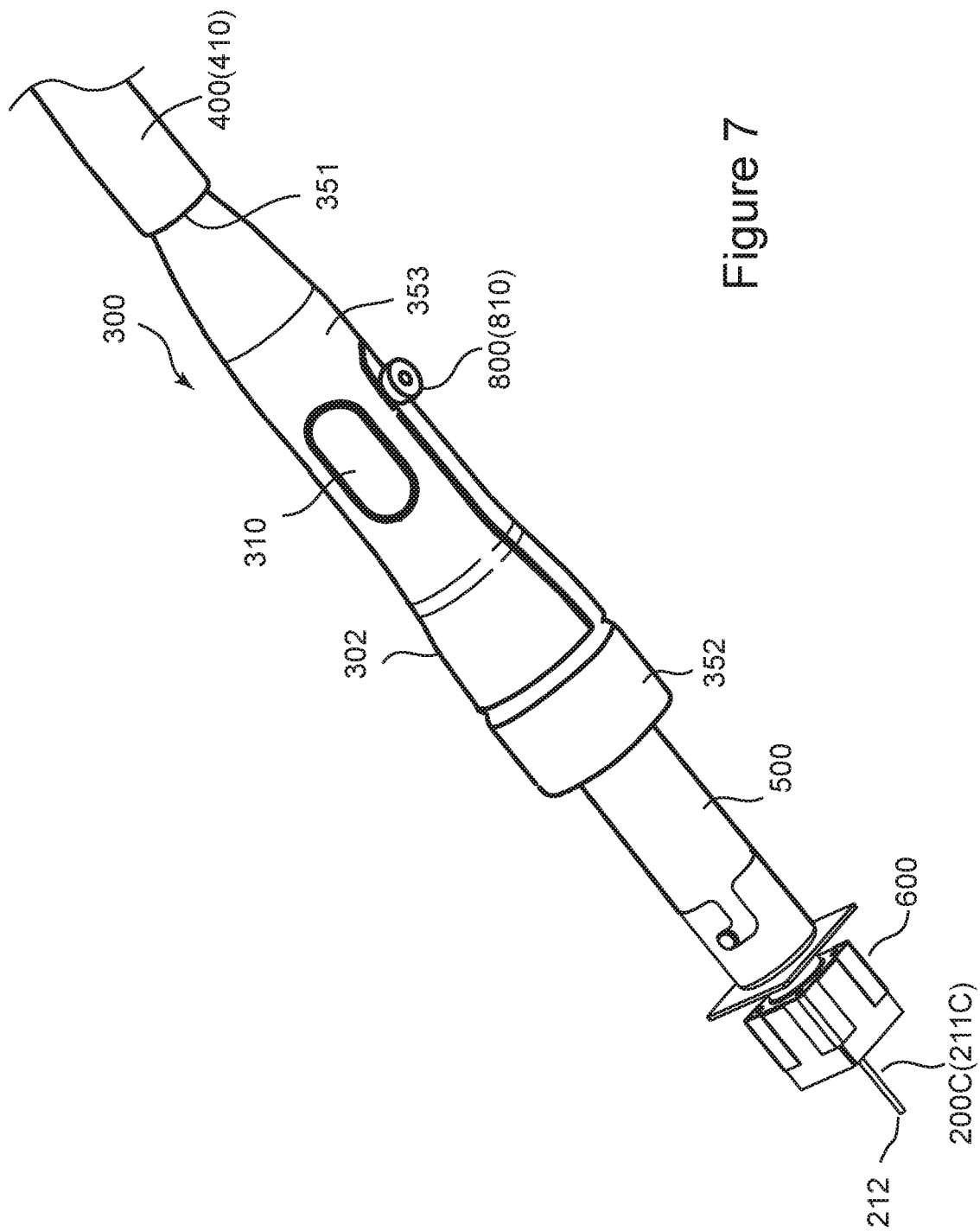
FIG. 7 is an illustrative perspective view of a re-work tool including the heating device of a fourth embodiment.

FIG. 7 is an illustrative perspective view of a re-work tool 300 including a heating device of the present invention positioned at the distal end of the re-work tool 300. The re-work tool 300 includes a handle cylinder 302, a cable 400, a heater assembly 500, and a nozzle 600. The handle cylinder 302 has an overall cylindrical shape. The handle cylinder 302 may be gripped by an operator, or alternatively, the handle cylinder 302 may be held by a positioning device (not shown) designed to adjust the position of the re-work tool 300 over a printed circuit board.

The handle cylinder 302 includes a proximal portion 351 and a distal portion 352 opposite to the proximal portion 351. The handle cylinder 302 gradually becomes thicker from the proximal portion 351 toward the distal portion 352. Cable 400 is attached to the proximal portion 351 of the handle cylinder 302. The heater assembly 500 is attached to and protrudes from the distal portion 352 of the handle cylinder 302. The nozzle 600 is fitted onto the end of the heater assembly 500.

The cable 400 in part defines a vacuum flow path for transmitting a suction force for securing the electronic component 102 as discussed above with respect to FIG. 3. The cable 400 also provides an air flow path for air flow for melting the bonding material, a power supply line, and a signal line as the required circuitry to interconnect to a control station (not shown). The suction pipe 211 extends the vacuum flow path from the cable 400 along the center axis of the handle cylinder 302, the heater assembly 500, and the nozzle 600. The suction pipe 211 includes a lower end 212 protruding from the nozzle 600. The description of the lower end 212 of the suction pipe 211 of the second embodiment is incorporated herein. As also depicted in FIG. 7, the handle cylinder 302 includes a transparent area 310 allowing the operator to view the position of an indicator 230 attached to the suction pipe 211 within the handle cylinder 302.

The air supplied to the handle cylinder 302 through the air flow path formed by the cable 400 flows from the proximal portion 351 of the handle cylinder 302 toward the distal portion 352. The air then flows into the heater assembly 500. The heater assembly 500 heats the air to a temperature sufficient to melt the bonding material. The hot air is ejected from the heater assembly 500 into the internal space of the nozzle 600, so that the bonding material located below or inside the nozzle 600 is melted by the hot air.

Figure 8:
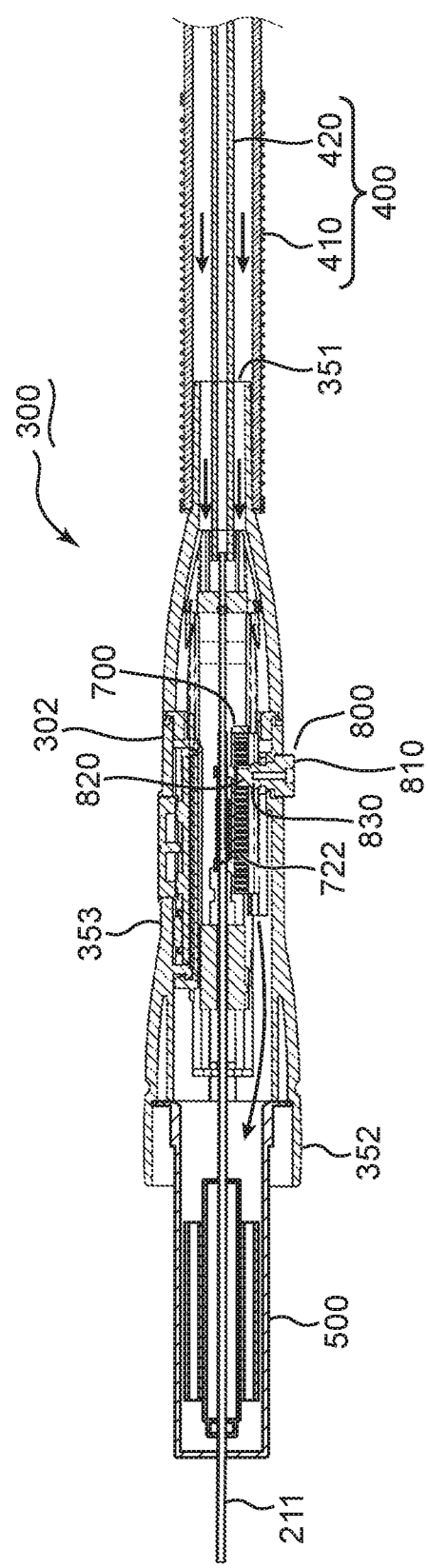
FIG. 8 is an illustrative cross section of the handle portion of the re-work tool shown in FIG. 7.

FIG. 8 is an illustrative cross section of the handle portion of the re-work tool 300 of FIG. 7. The proximal portion 351 of the handle cylinder 302 is a thin rigid cylinder. The cable 400 includes an outer tube 410 and an inner tube 420, each of which being formed from a flexible tube material. The proximal portion 351 of the handle cylinder 302 is fitted into the outer tube 410. The inner tube 420 is inserted through the handle cylinder 302 from the proximal portion 351 and connected to the suction pipe 211. The inner tube 420 is connected to a vacuum device (not shown) at its proximal end. Accordingly, the suction force generated by the vacuum device is transmitted through the inner tube 420 and the suction pipe 211 to be applied to an electrical component.

The outer tube 410 is connected at its proximal end to a blowing device (not shown) or control station that also provides electrical power to the re-work tool 300. The air sent out by the blower flows into the handle cylinder 302 through an air flow path formed between the inner tube 420 and the outer tube 410 of the cable 400.

The handle cylinder 302 comprises a rigid intermediate portion 353 extending from the proximal portion 351 to the distal portion 352. The intermediate portion 353 is preferably a rigid cylinder that gradually increases in diameter as it transitions from the proximal portion 351, to a generally constant diameter mid portion and then increasing in diameter again in the transition to the distal portion 352. The air having flowed into the proximal portion 351 of the handle cylinder 302 flows into the heater assembly 500 attached to the distal portion 352 through the space between the intermediate portion 353 and the suction pipe 211. In addition to the suction pipe 211, other components may including for example, a power line for supplying power to the heater device 100 and the heater assembly 500, a temperature sensor for detecting the temperature of the heater assembly 500 and a signal line or lines to connect the temperature sensor and a contact switch to a control station (not shown) may be disposed in the intermediate portion 353 of the re-work tool 300. The indicator 230 and the coil spring 220 described with respect to the exemplary configurations above may be disposed within the intermediate portion 353. The indicator 230 may also be connected to the power line and a signal line to act as a switch to provide an output signal when the indicator 230 moves to the position indicative of the electrical component 102 being successfully removed. The activation of the switch may, for example generate a light display on the re-work tool 300 or trigger an audible tone output from the control station, to notify the user when the de-solder process has occurred.

The heating device 100 positioned or attached to the distal end of the re-work tool 300 may incorporate various structures in the handle cylinder 302. These parts and structures do not completely block the air flow space between the intermediate portion 353 and the suction pipe 211, allowing air flow from the proximal portion 351 to the heater assembly 500 attached to the distal portion 352. The transparent area 310 is preferably positioned within the intermediate portion 353 and thus upstream of the heater assembly 500 in the air flow path.

The handle cylinder 302 may in the alternative be formed from a transparent material. However, in this case, the operator may unnecessarily view various parts disposed inside of the handle cylinder 302. As a result, the relative position or movement of the indicator 230 may be more difficult to recognize. If the handle cylinder is transparent only at the position corresponding to the indicator 230, the operator can easily recognize the position of the indicator 230. Exemplary techniques for forming the transparent area 310 with a transparent member, for example a window piece 301, under the low risk of leakage of air from the handle cylinder 302 are described below.

The re-work tool 300 further includes a dial piece 800. The dial piece 800 functions as an adjustment portion for relatively displacing a slider 700 with respect to the intermediate portion 353 and the suction pipe 211. The dial piece 800 includes a knob 810, a pinion 820, and a shaft 830. The knob 810 partially protrudes outwardly from the intermediate portion 353. The operator can rotate the knob 810. The pinion 820 is disposed in a concave groove of the slider 700 arranged in the intermediate portion 353, and meshes with the multiple teeth of the rack 722. The shaft 830 coaxially connects the knob 810 and the pinion 820 and is supported by the intermediate portion 353 allowing it to rotate. When the operator rotates the knob 810, the pinion 820 also rotates. As a result, the slider 700 can be displaced relative to the intermediate portion 353.

Figure 9:
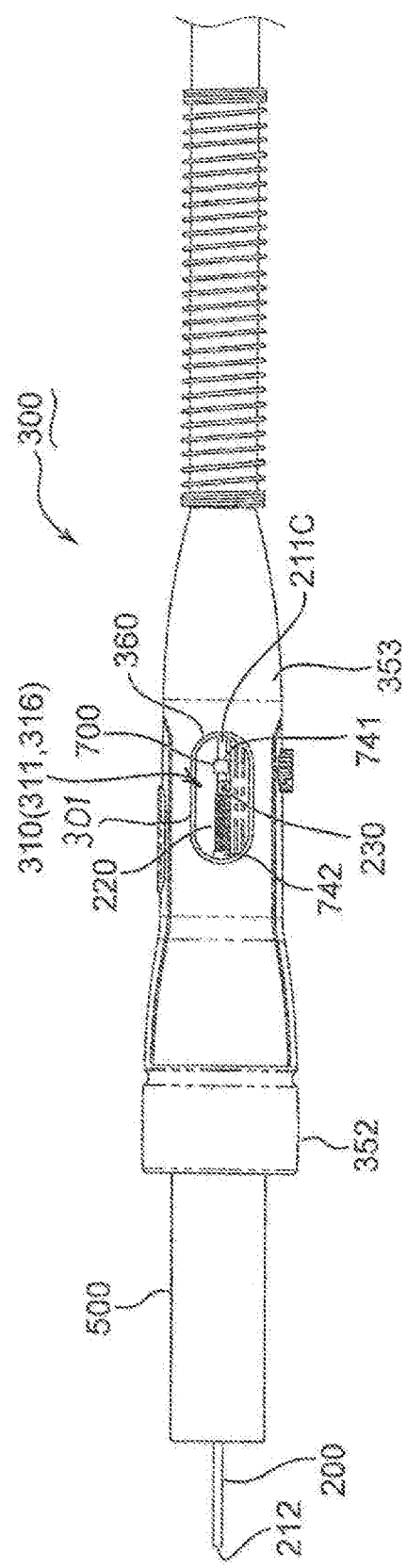
FIG. 9 is an illustrative side view of the handle portion of the re-work tool shown in FIG. 8

FIG. 9 is an illustrative side view of the handle portion of the re-work tool 300 shown in FIGS. 7 and 8. The handle cylinder 302 includes a transparent window piece 301 and a packing 360 surrounding the window piece 301. The operator can visually recognize the indicator 230 within the handle cylinder 302 through the window piece 301. The window piece 301 corresponds to the transparent area 301 described and shown above with respect to FIG. 3.

The handle cylinder 302 encloses the coil spring 220 and the indicator 230 in addition to the suction pipe 211, portions of which may all be viewed through the window piece 301. The coil spring 220 is positioned around the suction pipe 211 in the intermediate portion 353 of the handle cylinder 302. The indicator 230 is fixed to the suction pipe 211 inside the intermediate portion 353. The indicator 230 is adjacent to the upper end of the coil spring 220. The coil spring 220 corresponds to the coil spring 220 described with reference to FIG. 3. The indicator 230 corresponds to the indicator 230 described with reference to FIG. 3.

An elliptical through hole is formed in the intermediate portion 353 at a position corresponding to the displacement range of the indicator 230. The window piece 301 covers the through hole formed in the intermediate portion 353, and is supported by the intermediate portion 353. Therefore, the operator can visually recognize at least a part of the indicator 230 and the coil spring 220 through the window piece 301. The packing 360 keeps the boundary between the window piece 301 and the intermediate portion 353 airtight around the through hole. Therefore, the air flowing through the intermediate portion 353 toward the distal portion 352 of the handle cylinder 302 will not leak out. As depicted in FIG. 9, the re-work tool 300 may also include a slider 700.

The slider 700 includes a base 710, an upper connecting claw 741, and a lower connecting claw 742. The upper connecting claw 741 and the lower connecting claw 742 protrude from the base 710. The lower connecting claw 742 is located between the upper connecting claw 741 and the lower end 212 of the suction pipe 211. Each of the upper connecting claw 741 and the lower connecting claw 742 are substantially C-shaped to fit around the suction pipe 211 in a snap-fit manner. The suction pipe 211 can be relatively displaced axially with respect to the slider 700.

Figure 10:
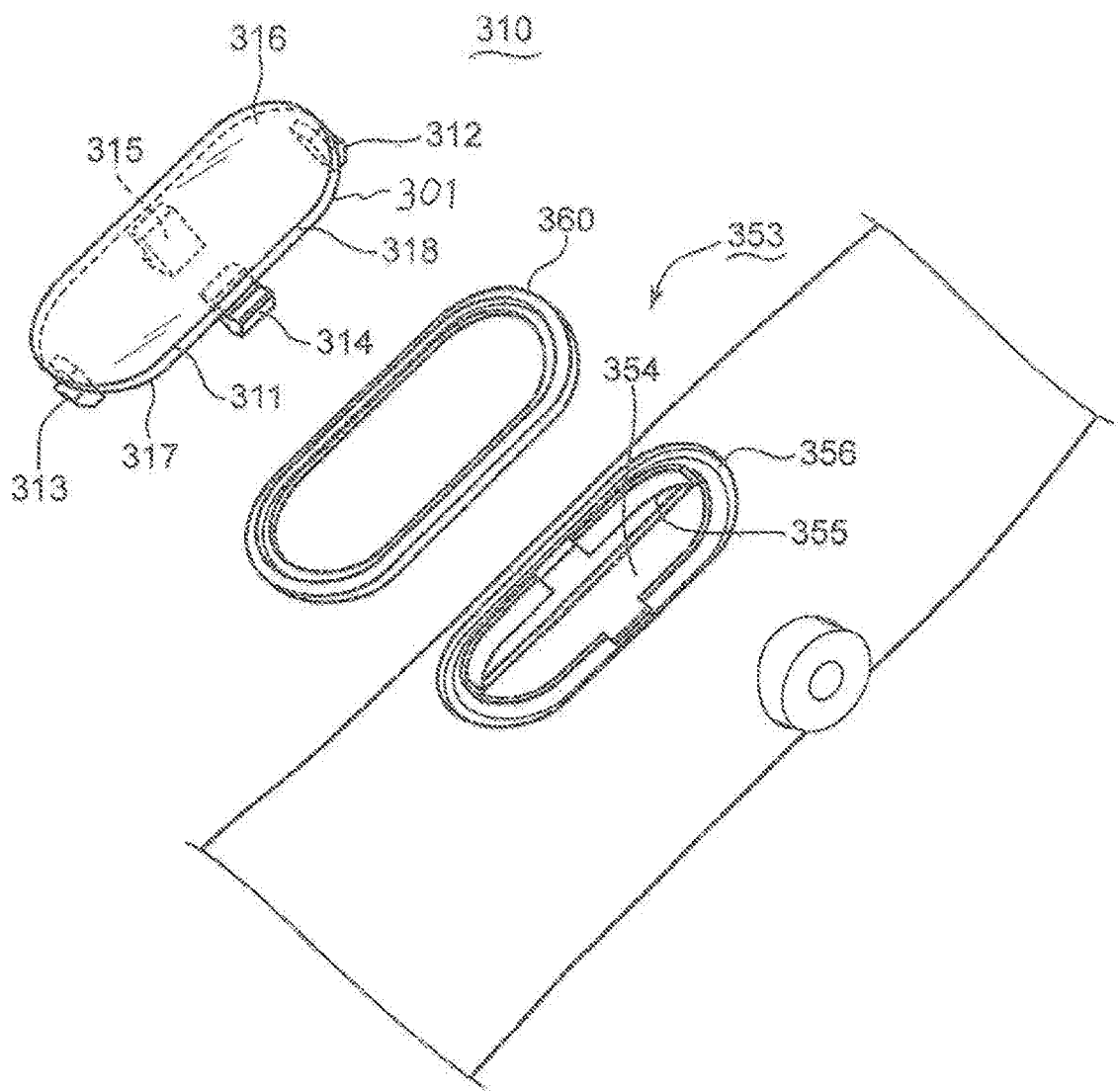
FIG. 10 is an illustrative exploded perspective view of a segment of the intermediate portion of the re-work tool, providing an exploded view of the components of the transparent area.

FIG. 10 is an illustrative exploded perspective view of a segment of the intermediate portion 353 of the re-work tool 300, providing an exploded view of the components of the transparent area 310. FIG. 10 shows the elliptical through-hole 354, the packing 360 and the window piece 301 formed in the intermediate portion 353. The window piece 301 includes a transparent plate 311 and four engaging hooks 312, 313, 314, 315. The transparent plate 311 covers the through-hole 354 formed in the intermediate portion 353. The transparent plate 311 includes an outer surface 316, an inner surface 317, and a peripheral surface 318. The engaging hooks 312, 313, 314, 315 protrude from the inner surface 317 and are inserted into the through hole of the intermediate portion 353. The engaging hooks 312, 313 are located on the long axis of the ellipse formed by the inner surface 317 and protrude from the inner surface 317 near the peripheral surface 318. The engaging hooks 314, 315 are located on the short axis of the ellipse formed by the inner surface 317 and protrude from the inner surface 317 near the peripheral surface 318.

The intermediate portion 353 includes a peripheral edge 355 and a groove surface 356. The peripheral edge 355 forms the boundary of the through-hole 354. The groove surface 356 is adjacent to the peripheral edge 355 and surrounds the through-hole 354. The groove surface 356 forms a slightly recessed groove from the outer surface of the intermediate portion 353. The packing 360 is fitted into the groove formed by the groove surface 356 and then the window piece 301 is inserted so that the engaging claws 312, 313, 314, 315 snap in and engage with the peripheral edge 355. As a result, the window piece 301 is securely fixed into the intermediate portion 353. As an alternative, the engaging claws 314 and 315 disposed on opposite sides of the window piece 301 may include light emitting diodes (LEDs) connected the switch triggered by the indicator 230 whereby the LEDs cause the window piece to glow with the color of the LED when the indicator 230 moves to the position indicating that the electrical component 102 has been successfully removed.

The inner peripheral portion of the packing 360 overlaps the inner surface 317 of the transparent plate 311 in the vicinity of the peripheral surface 318 of the transparent plate 311 and is compressed by the groove surface 356 and the inner surface 317. The outer portion of the packing 360 overlaps the peripheral surface 318 of the transparent plate 311 and it is compressed between the peripheral surface 318 and the groove surface 356. Since the packing 360 is compressed in two directions, leakage of air from the through-hole 354 is unlikely.

Figure 11:
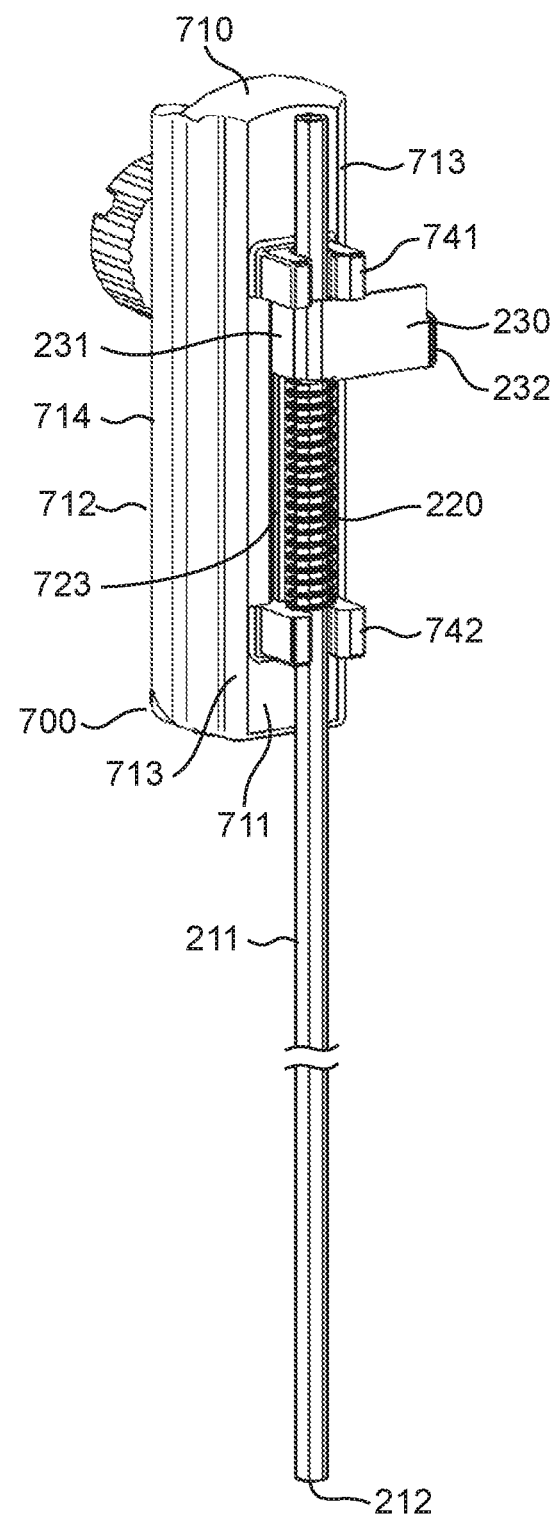
FIG. 11 is an illustrative perspective view of the slider and spring assembly of the re-work tool shown in FIG. 7.

FIG. 11 is an illustrative perspective view of the slider 700 and the spring coil 220 of the re-work tool shown in FIG. 7. As discussed above, the slider 700 includes a base 710, a proximal or upper connecting claw 741, and a distal or lower connecting claw 742. The coil spring 220 is positioned around the suction pipe 211. The indicator 230 is fixed to the suction pipe 211 between the upper connecting claw 741 and the lower connection claw 742 and protrudes toward the window piece 301 as shown in FIG. 9. The coil spring 220 is located between the indicator 230 and the lower connecting claw 742. The lower end of the coil spring 220 abuts against the lower connecting claw 742. The upper end of the coil spring 220 abuts the indicator 230. In this embodiment, the indicator 230 is sandwiched between the upper connection claw 741 and the upper end of the coil spring 220.

In an alternative embodiment, the coil spring 220 may be placed between the indicator 230 and the upper connecting claw 741. Based on the design principle described in connection with the embodiment of FIG. 5, the distal or lower end of the coil spring 220 is connected to the indicator 230 and the proximal or upper end of the coil spring is connected to the upper connecting claw 741.

The base 710 of the slider 700 includes a first side 711, a second side 712, two side surfaces 713, and two elongated projections 714. The upper connection claw 741 and the lower connection claw 742 protrude from the first side 711 toward the suction pipe 211. The second side 712 is located on the opposite side of the first side 711. Each of the two side surfaces 713 is an elongated surface extending in the vertical direction between the first side 711 and the second side 712. Each of the two projections 714 protrude from the side face 713 and extend in the vertical direction.

Figure 12:
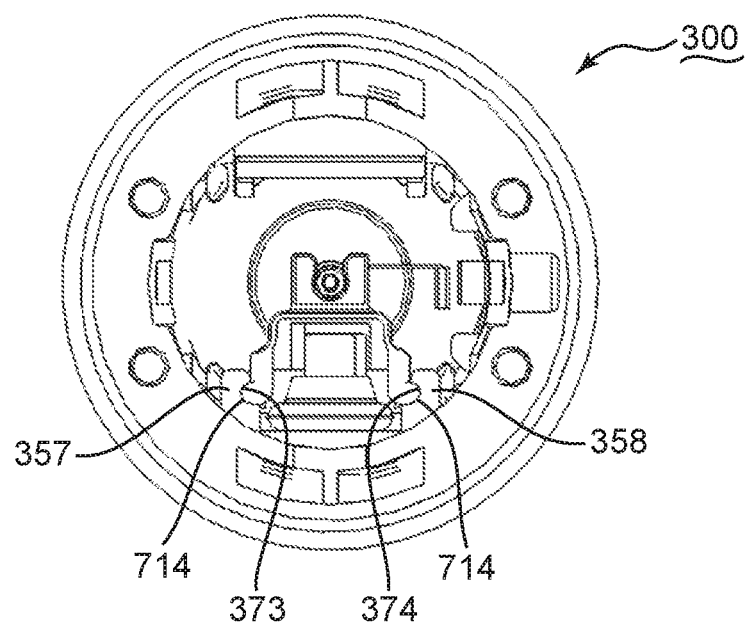
FIG. 12 is an illustrative bottom view of the handle portion of the re-work tool shown in FIG. 9

FIG. 12 is an illustrative bottom view of the handle portion of the re-work tool 300 shown in FIG. 9. As shown in FIG. 12, the intermediate portion 353 of the handle cylinder 302 includes a first projection wall 357 and a second projection wall 358 which protrude inward of the handle cylinder 302 and extend in the axial direction. Engaging grooves 373, 374 which face each other and extend in the axial direction are formed in the first projection wall 357 and the second projection wall 358. The two elongated projections 714 of the base 710 are fitted into the engaging groove 373 of the first projection wall 357 and the engaging groove 374 of the second projection wall 358, respectively. As a result, the slider 700 is attached to the intermediate portion 353. The slider 700 can be displaced axially within the intermediate portion 353. The indictor 230 includes a distal end portion 232 that may be painted to increases its visibility.

Figure 13:
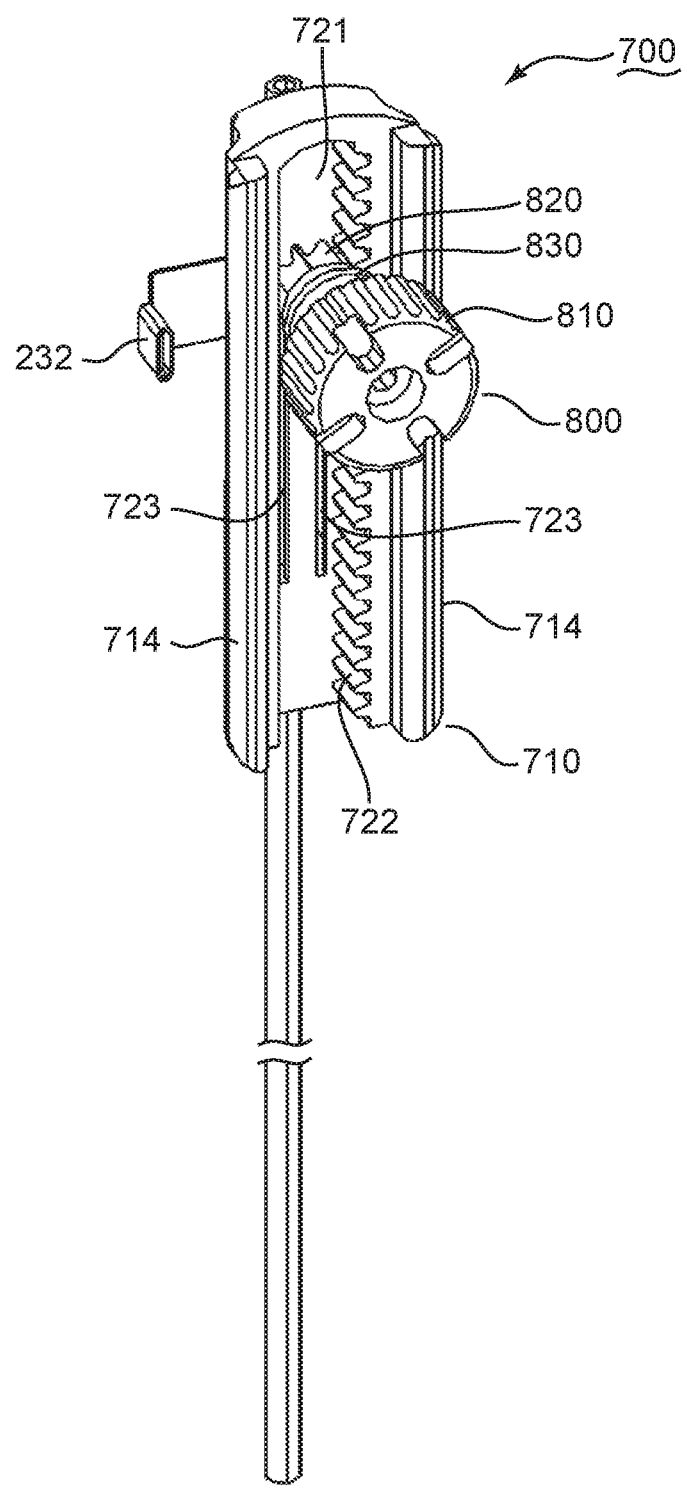
FIG. 13 is an illustrative perspective view of the slider of the re-work tool shown in FIG. 7.

FIG. 13 is an illustrative schematic perspective view of the assembly of the slider 700 of the re-work tool 300 shown in FIG. 7. The slider 700 includes the base 710 having a first side 711, a second side 712, two side surfaces 713, and two elongated projections 714. On the second side 712 of the base 710, a recessed groove 721 extending in the axial direction is formed. The slider 700 includes a rack 722 that forms a face in the depth direction of the recessed groove 721. On the rack 722, a multiple teeth each having a tooth profile extending in the depth direction of the recessed groove 721 are formed. The multiple teeth are aligned in the axial direction. Therefore, the rack 722 can function as a rack for displacing the slider 700 in the axial direction.

As discussed above, the dial piece 800 functions as an adjustment portion for relatively displacing the slider 700 with respect to the suction pipe 211. The dial piece 800 includes the knob 810, the pinion 820, and the shaft 830 as depicted in FIG. 13. The operator can rotate the knob 810, whereby the pinion 820 disposed in the recessed groove 721 of the slider 700 meshes with the multiple teeth of the rack 722, When the operator rotates the knob 810, the pinion 820 also rotates.

As shown in FIGS. 11 and 13, two grooves 723 extending in the vertical direction are formed in the slider 700. The indicator 230, affixed to the suction pipe 211, includes a base portion 231 and a distal end portion 232 opposite to the base portion 231. The base portion 231 is inserted through one of the two grooves 723, as depicted in FIG. 11. The indicator 230 bends so as to surround the suction pipe 211 and protrude toward the window piece 301 of FIG. 9. The distal end portion 232 is a free end on the side protruding toward the window piece 301. The portion of the indicator 230 wound around the suction pipe 211 is secured to the suction pipe 211. Therefore, the indicator 230 prevents twisting or rotation of the suction pipe 211 while moving axially up and down in conjunction with the suction pipe 211 that is inserted into the upper connecting claw 741 and the lower connecting claw 742 of the slider 700.

Figure 14A:
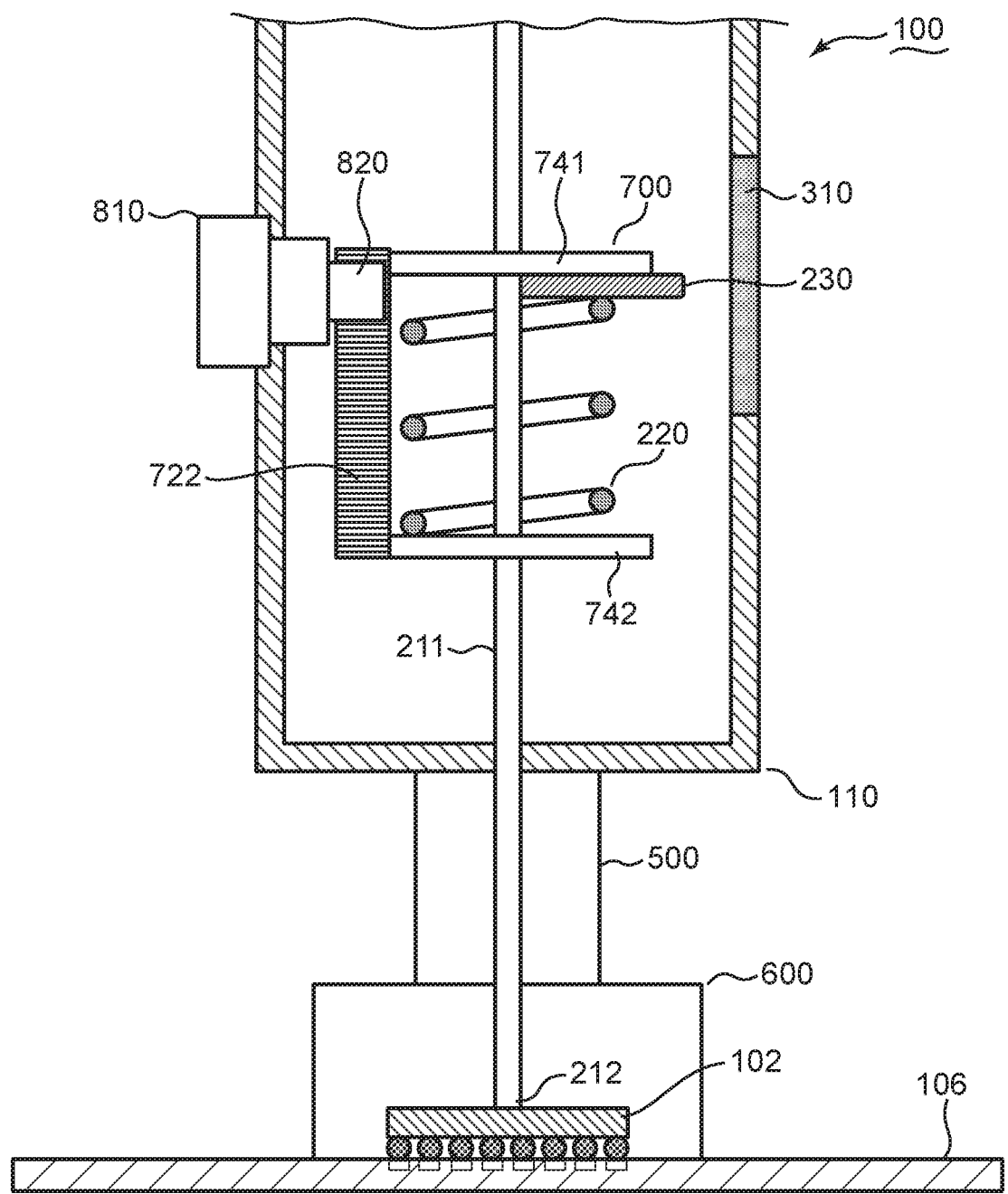
FIG. 14A is an illustrative cross section of the re-work tool shown in FIG. 7
Figure 14B:
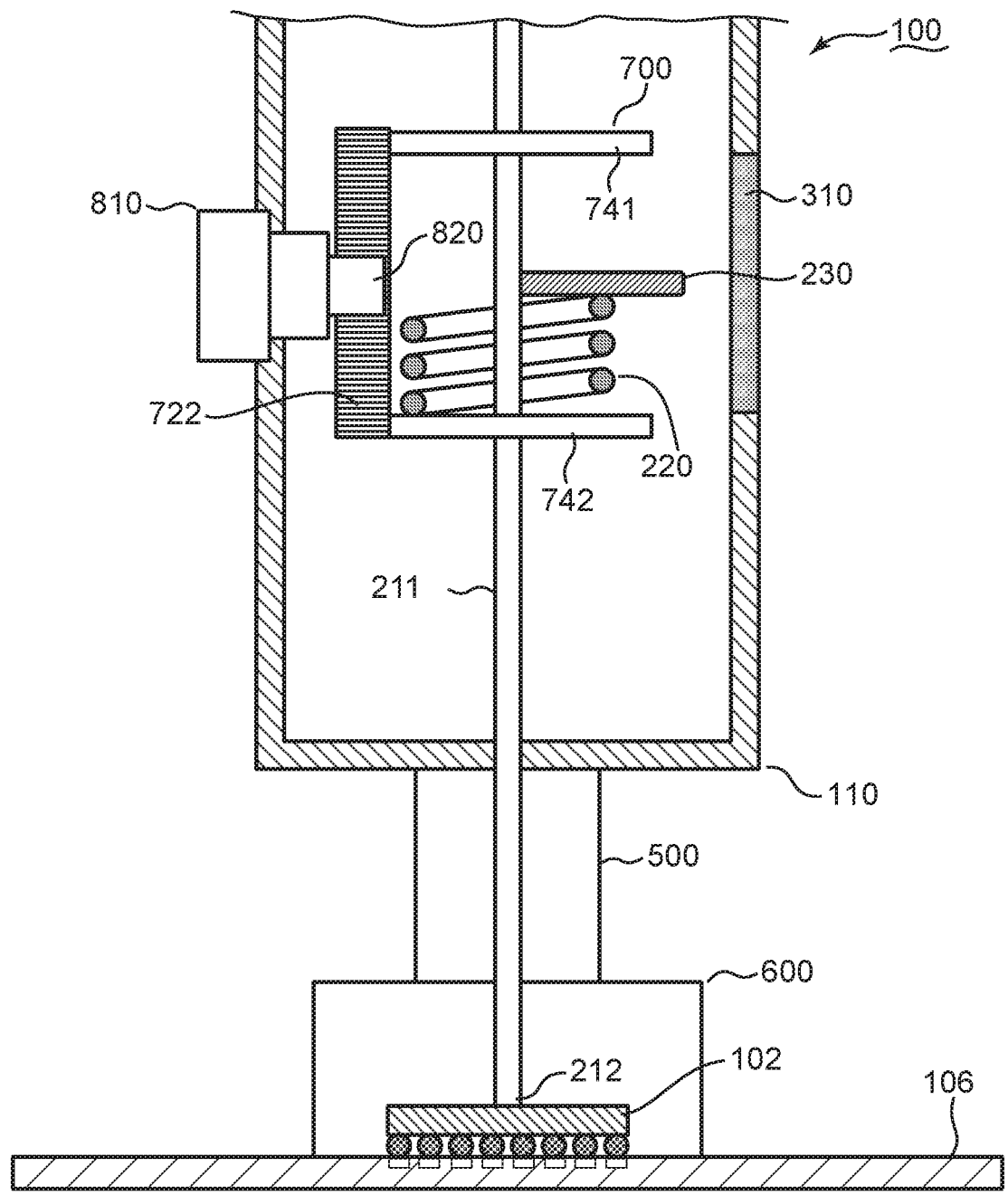
FIG. 14B is an illustrative cross section of the heating device of the re-work tool where the electrical component is biased from the heating device.
Figure 14C:
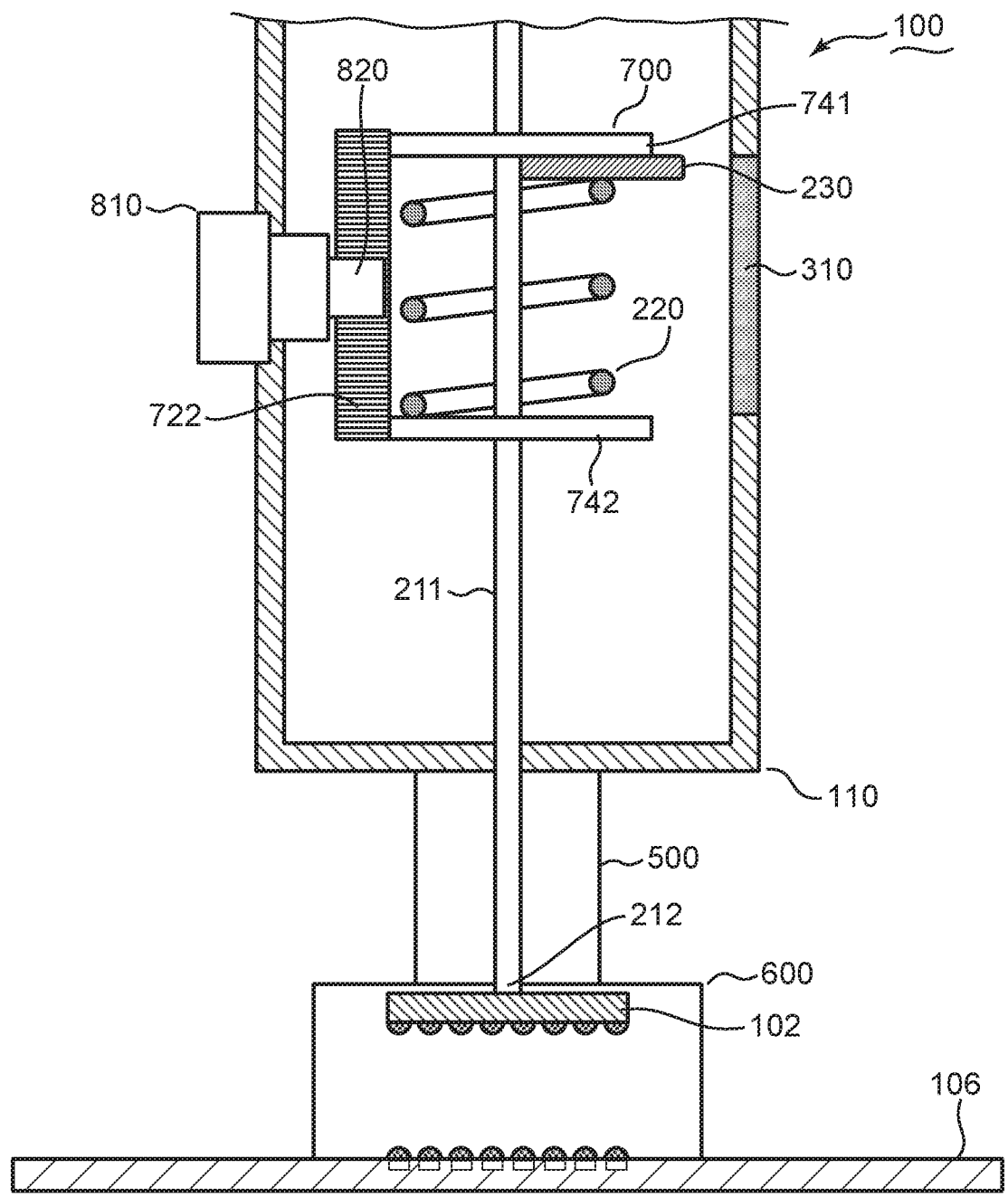
FIG. 14C is an illustrative cross section of the heating device of the re-work tool where the electrical component is removed by the heating device.

FIG. 14A is an illustrative cross section of a re-work tool 300 and heating device 100 according to the configuration depicted in FIG. 7. FIG. 14B is an illustrative cross section of the heating device 100 and the re-work tool 300, where the electrical component 102 is being biased by the heating device 100 and re-work tool 300. FIG. 14C is an illustrative cross section of the heating device 100 and the re-work tool 300, where the electrical component 102 is removed. FIGS. 14A to 14C illustrate the slider 700, the coil spring 220, the indicator 230, the transparent area 310 and the suction pipe 211 within the re-work tool 300, to clearly show the relationship between the movement of the knob 810, the pinion 820, the rack 722 and the displacement of the indicator 230.

As shown in FIG. 14A, the operator positions the handle cylinder 302 substantially perpendicularly to the substrate using a hand or a positioning device (not shown), and lowers the handle cylinder 302 toward the electronic component 102. Since the pinion 820 meshes with the rack 722, the slider 700, the coil spring 220 and the indicator 230 descend together with the handle cylinder 302. The indicator 230 shown in Ha 14A is visually recognized at substantially the center of the transparent area 310. At this time, the coil spring 220 has a substantially natural length.

As a result of the descent of the handle cylinder 302, the nozzle 600 comes into contact with the upper surface of the substrate of the printed circuit board 106 and the nozzle 600 surrounds the electronic component 102. The operator then brings the lower end 212 of the suction pipe 211 into contact with the upper surface of the electronic component 102 and operates the vacuum device and the air blower connected to the re-work tool 300. As a result, the electronic component 102 is sucked onto the lower end 212 of the suction pipe 211.

The operator then rotates the knob 810 so that the components are configured as shown in FIG. 141. The pinion 820 rotates with the knob 810 to raise the rack 722. As a result, the upper connecting claw 741 and the lower connecting claw 742 move up relative to the suction pipe 211. Meanwhile, the coil spring 220 is elastically compressed between the lower connecting claw 742 and the indicator 230. The handle cylinder 302 and the suction pipe 211 do not move, because the electrical component 102 is still secured to the printed circuit board 106. The relative position of the indicator 230 in the visible range of the transparent area 310 does not change.

When the bonding material or solder is melted (by hot air blown into the space defined by the nozzle 600 and the printed circuit board 106), the bonding force securing the electronic component 102 to the circuit board 106 decreases. As a result, the restoring force of the coil spring 220 becomes greater than the coupling force between the circuit board 106 and the electronic component 102, and the coil spring 220 restores to an unbiased state. Since the rack 722 is engaged with the pinion 820, the lower connecting claw 742 is stationary during expansion of the coil spring 220. As shown in FIG. 14B, there is a space between the indicator 230 and the upper connecting claw 741. Since the suction pipe 211 can be relatively displaced with respect to the upper connecting claw 741 and the lower connecting claw 742, the indicator 230 and the suction pipe 211 are displaced upward until the indicator 230 abuts on the upper connecting claw 741, as shown in FIG. 14C. Since the electronic component 102 is sucked to the lower end 212 of the suction pipe 211 by the suction force generated by the vacuum device, the electronic component 102 rises together with the lower end 212 of the suction pipe 211 and is separated from the substrate of the printed circuit board 106.

As compared to the position of the indicator 230 shown in FIG. 14B, the position of the indicator 230 after the electronic component 102 has been removed is shown FIG. 14C, at a position relatively higher in the transparent area 310. Therefore, the operator visually recognizes the displacement of the indicator 230 from substantially the center of the transparent area 310 to the vicinity of the upper edge of the transparent area 310, confirming the separation of the electronic component 102 from the substrate.

The heating device 100 and the re-work tool 300 of the present invention allow an operator to conduct an electrical component removal procedure that comprises the steps of: placing the nozzle of the heating device 100 over an electrical component whereby a suction pipe applies a vacuum force to the top of said electrical component; lifting the re-work tool after the suction pipe is secured to said electrical component biasing a spring within said re-work tool; visually identifying the position of an indicator within said re-work tool; heating the solder to its melting point whereupon the spring automatically lifts the component free from said substrate, and the user can confirm that the electrical component has been moved by visually identifying the change in the position of the indicator.

The re-work tool 300 of the present invention alternatively allows an operator to conduct an electrical component removal procedure that comprises the steps of: providing a heating device including a securing member, a bias element, and an indicator within an enclosure; positioning said securing member on said electrical component and applying a securing force; biasing said bias member to exert a lifting force on said electrical component, the biasing resulting in the indicator being located in a first position; and applying heat to weaken the solder bonding the electrical component to the circuit board whereupon said bias member returns to an unbiased state lifting the electronic component from the circuit board and displacing said indicator to a second position.

The design principles described in connection with the various embodiments described above are applicable to a variety of heating appliances. Some of the various features described in connection with one of the various embodiments described above may be applied to the heating appliance described in connection with another alternative embodiment.

The invention claimed is:

1. A tool including a heating device to remove electrical components soldered to a substrate, the tool comprising:
   a heater assembly;
   a holding member including an indicator and a holding part, said holding part at the distal end of said holding member;
   an enclosure that surrounds at least a part of said holding member;
   a bias member exerting a biasing force on said holding member in a direction away from said substrate, the biasing force of said biasing member lifts an electrical component off of said substrate when said electrical component is desoldered from said substrate;
   said indicator securely attached to said holding member, said indicator moving between a first position when said holding part is secured to said electrical component soldered to said substrate and a second position when said holding part desolders said electrical component from said substrate;
   a transparent area in said enclosure disposed radially adjacent to said indicator, the transparent area dimensioned to extend over the entire range of positions of said indicator from said first position to said second position; and
   a first insert part attached to a sidewall of said enclosure and a second insert part attached to the sidewall of said enclosure, wherein said holding member is axially inserted into said first and second insert parts, said bias member positioned between said first and second inserts parts with one end of said bias member abutting one of said first and second insert parts.

2. The tool including the heating device of claim 1, wherein said holding member is a suction pipe and said holding part is an open end to secure the electrical component.

3. The tool including the heating device of claim 2, further comprising an air passage formed between the enclosure and said suction pipe.

4. The tool including the heating device of claim 2, wherein said bias member is a coil spring.

5. The tool including the heating device of claim 2, wherein said indicator is secured to the suction pipe between said first and second insert parts, and said indicator projects radially outward toward said transparent area.

6. The tool including the heating device of claim 5, wherein said coil spring is located between said indicator and said second insert part.

7. The tool including the heating device of claim 5, wherein an end of said coil spring is connected to said first insert part and an opposite end of said coil spring is connected to said indicator.

8. The tool including the heating device of claim 1 further comprising a slide base slidably attached to a sidewall of said enclosure, the slide base attaching said first and second insert parts to said sidewall, an adjustment portion to change the position of the slide base within said enclosure and with respect to said suction pipe, and whereby said coil spring is biased by the relative change in position of the slide base with respect to said suction pipe.

9. The tool including the heating device of claim 1, wherein said enclosure includes a window piece in said transparent area, and a sealing member to keep air-tightness of the border of the window piece.

10. The tool including the heating device of claim 1 further comprising a slide base including an axial groove, said indicator having a distal end projecting toward said transparent area, and a proximal end inserted in said groove extending axially in said slide base.

11. The tool including the heating device of claim 1 further comprising a slide base, said slide base comprising: said first and second inserts, a rack, an adjustment portion including a pinion and a knob where the knob can be rotated from outside of the enclosure of said tool to adjust the position of said slide base.

12. The tool including the heating device of claim 4, further comprising a switch triggered by said indicator and an output device activated by said switch to notify a user when a de-soldering procedure has been completed.

13. A heater device for a re-work tool, the heater device comprising:
   a heater assembly;
   a holding member including an indicator and a holding part, said holding part at the distal end of said holding member;
   an enclosure that surrounds at least a part of said holding member;
   a bias member exerting a biasing force on said holding member in a direction away from said substrate;
   said indicator securely attached to and moving with said holding member, said indicator moving between a first position when said holding part is secured to an electrical component soldered to a substrate and a second position when said holding part desolders said electrical component from said substrate; and
   an upper protrusion extending from a sidewall of the enclosure and a lower protrusion extending from the sidewall of the enclosure, wherein said holding member is axially inserted into the upper and lower protrusions, said bias member positioned between the upper and lower protrusions with one end of the bias member abutting one of said upper and lower protrusions.

14. The heater device of claim 13, further comprising:
a transparent area in said enclosure disposed radially adjacent to said indicator to allow a user to view the change of position of said indicator.

\* \* \* \* \*